US011728159B2

(12) United States Patent
Harada et al.

(10) Patent No.: US 11,728,159 B2
(45) Date of Patent: Aug. 15, 2023

(54) METHOD OF MANUFACTURING SEMICONDUCTOR DEVICE, SURFACE TREATMENT METHOD, SUBSTRATE PROCESSING APPARATUS, AND RECORDING MEDIUM

(71) Applicant: KOKUSAI ELECTRIC CORPORATION, Tokyo (JP)

(72) Inventors: Kazuhiro Harada, Toyama (JP); Masayoshi Minami, Toyama (JP); Akihito Yoshino, Toyama (JP); Masaya Nishida, Toyama (JP); Naoko Kitagawa, Toyama (JP); Shintaro Kogura, Toyama (JP); Shogo Otani, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 17 days.

(21) Appl. No.: 17/575,269

(22) Filed: Jan. 13, 2022

(65) Prior Publication Data
US 2022/0139693 A1 May 5, 2022

Related U.S. Application Data

(63) Continuation of application No. 16/712,402, filed on Dec. 12, 2019, now Pat. No. 11,257,669.

(30) Foreign Application Priority Data

Dec. 13, 2018 (JP) ................................. 2018-233088

(51) Int. Cl.
*H01L 21/02* (2006.01)
*C23C 16/44* (2006.01)
(Continued)

(52) U.S. Cl.
CPC ...... *H01L 21/0214* (2013.01); *C23C 16/4405* (2013.01); *C23C 16/52* (2013.01);
(Continued)

(58) Field of Classification Search
CPC ............ C23C 16/4404; C23C 16/4405; C23C 16/45574; C23C 16/52; H01L 21/02126; H01L 21/0228; H01L 21/67253
See application file for complete search history.

(56) References Cited

U.S. PATENT DOCUMENTS

2004/0134427 A1* 7/2004 Derderian ........... H01J 37/3244
118/715
2006/0065635 A1 3/2006 Derderian et al.
(Continued)

FOREIGN PATENT DOCUMENTS

CN 1798867 A 7/2006
JP 2009-197274 A 9/2009
(Continued)

OTHER PUBLICATIONS

Japanese Office Action dated Mar. 2, 2021 for Japanese Patent Application No. 2018-233088.
(Continued)

*Primary Examiner* — Jaehwan Oh
(74) *Attorney, Agent, or Firm* — Volpe Koenig

(57) ABSTRACT

There is provided a technique that includes: (a) forming a film on a substrate in a process container by performing a cycle a predetermined number of times, the cycle including: supplying an oxygen-containing gas from a pipe made of metal to the substrate in the process container; supplying a nitrogen-and-hydrogen-containing gas from the pipe to the substrate in the process container; and (b) forming a layer on an inner surface of the pipe by supplying a surface treatment
(Continued)

gas into the pipe such that the surface treatment gas chemically reacts with the inner surface of the pipe.

26 Claims, 7 Drawing Sheets

(51) Int. Cl.
    *C23C 16/52*     (2006.01)
    *H01L 21/67*     (2006.01)

(52) U.S. Cl.
    CPC .... *H01L 21/0228* (2013.01); *H01L 21/02211* (2013.01); *H01L 21/67248* (2013.01); *H01L 21/67253* (2013.01)

(56) References Cited

U.S. PATENT DOCUMENTS

| | | |
|---|---|---|
| 2014/0248783 A1 | 9/2014 | Kameda et al. |
| 2015/0129047 A1* | 5/2015 | Gu .......................... F16K 27/02 137/15.04 |
| 2016/0097126 A1* | 4/2016 | Kogura ................ H01L 21/0214 118/704 |
| 2016/0244875 A1* | 8/2016 | Sasajima ........... H01L 21/02219 |
| 2017/0372890 A1* | 12/2017 | Horiike ............. C23C 16/45544 |
| 2018/0171467 A1* | 6/2018 | Hatta ..................... C23C 14/542 |

FOREIGN PATENT DOCUMENTS

| | | |
|---|---|---|
| JP | 2014-170786 A | 9/2014 |
| JP | 2016-072587 A | 5/2016 |
| JP | 2016-157871 A | 9/2016 |
| TW | 201703146 A | 1/2017 |

OTHER PUBLICATIONS

Taiwanese Office Action dated Sep. 24, 2020 for Taiwanese Patent Application No. 108143852.

* cited by examiner

METHOD OF MANUFACTURING SEMICONDUCTOR DEVICE, SURFACE TREATMENT METHOD, SUBSTRATE PROCESSING APPARATUS, AND RECORDING MEDIUM

CROSS-REFERENCE TO RELATED APPLICATION

This application is a continuation application of U.S. patent application Ser. No. 16/712,402 filed on Dec. 12, 2019 which is based upon and claims the benefit of priority from Japanese Patent Application No. 2018-233088, filed on Dec. 13, 2018, the entire contents of which are incorporated herein by reference.

TECHNICAL FIELD

The present disclosure relates to a method of manufacturing a semiconductor device, a surface treatment method, a substrate processing apparatus, and a recording medium.

BACKGROUND

In the related art, as a process of manufacturing a semiconductor device, a process of processing a substrate in a process container is often carried out.

SUMMARY

Some embodiments of the present disclosure provide a technique capable of improving the quality of substrate processing performed in a process container.

According to one or more embodiments of the present disclosure, there is provided a technique that includes: (a) forming a film on a substrate in a process container by performing a cycle a predetermined number of times, the cycle including: supplying a precursor gas from a first pipe made of metal and a first nozzle to the substrate in the process container; supplying an oxygen-containing gas from a second pipe made of metal and a second nozzle to the substrate in the process container; and supplying a nitrogen-and-hydrogen-containing gas from the second pipe and the second nozzle to the substrate in the process container; and (b) forming a continuous fluorine-containing layer on an inner surface of the second pipe by supplying a fluorine-containing gas into the second pipe such that the fluorine-containing gas chemically reacts with the inner surface of the second pipe.

DETAILED DESCRIPTION

One or More Embodiments of the Present Disclosure

One or more embodiments of the present disclosure will now be described mainly with reference to FIGS. 1 to 5.

(1) Configuration of Substrate Processing Apparatus

Figure 1:
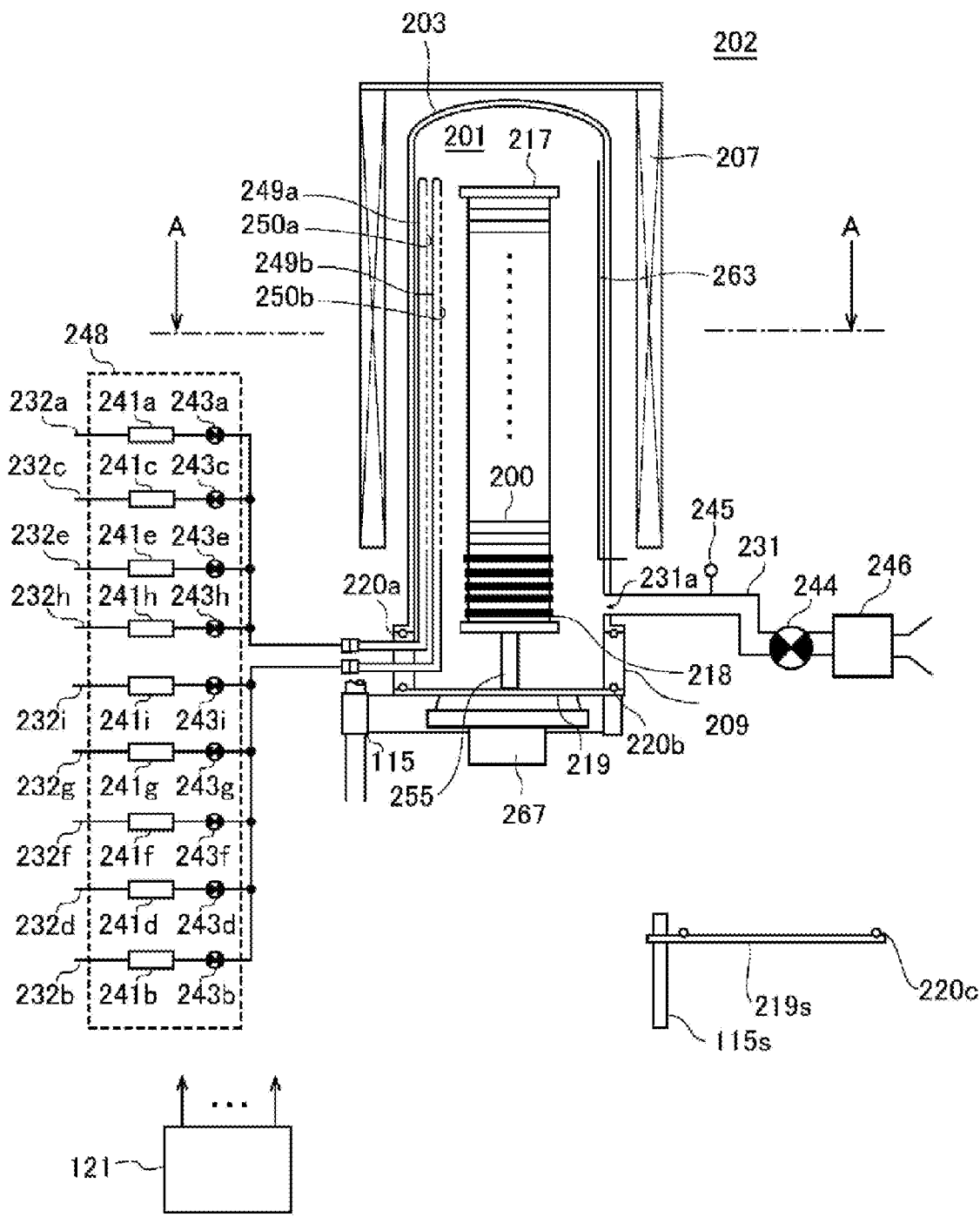
FIG. 1 is a schematic configuration view of a vertical process furnace of a substrate processing apparatus suitably used in one or more embodiments of the present disclosure, in which a portion of the process furnace is shown in a vertical cross section.

As illustrated in FIG. 1, a process furnace 202 includes a heater 207 as a heating mechanism (a temperature adjustment part). The heater 207 has a cylindrical shape and is supported by a support plate so as to be vertically installed. The heater 207 also functions as an activation mechanism (an excitation part) configured to thermally activate (excite) gas.

A reaction tube 203 is disposed inside the heater 207 to be concentric with the heater 207. The reaction tube 203 is made of, for example, a heat resistant material such as quartz ($SiO_2$), silicon carbide (SiC) or the like, and has a cylindrical shape with its upper end closed and its lower end opened. A manifold 209 is disposed to be concentric with the reaction tube 203 under the reaction tube 203. The manifold 209 is made of, for example, a metal material such as stainless steel (SUS) or the like, and has a cylindrical shape with both of its upper and lower ends opened. The upper end portion of the manifold 209 engages with a lower end portion of the reaction tube 203 so as to support the reaction tube 203. An O-ring 220a serving as a seal member is installed between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to accommodate a plurality of wafers 200 as substrates. Processing on the wafers 200 is performed in the process chamber 201.

Nozzles 249a and 249b as first and second non-metallic supply parts are installed in the process chamber 201 so as to penetrate through a sidewall of the manifold 209. The nozzles 249a and 249b are also referred to as first and second nozzles. The nozzles 249a and 249b are each made of, for example, a non-metallic material such as quartz, SiC, or the like. The nozzles 249a and 249b are each configured as a common nozzle used for supplying a plurality of types of gases.

Gas supply pipes 232a and 232b as first and second pipes made of metal are connected to the nozzles 249a and 249b, respectively. The gas supply pipes 232a and 232b are each configured as a common pipe used for supplying a plurality of types of gases. Mass flow controllers (MFCs) 241a and 241b, which are flow rate controllers (flow rate control parts), and valves 243a and 243b, which are opening/closing valves, are installed in the gas supply pipes 232a and 232b, respectively, sequentially from an upstream side of gas flow. Gas supply pipes 232c, 232e, and 232h are connected to the gas supply pipe 232a at a downstream side of the valve 243a. MFCs 241c, 241e, and 241h and valves 243c, 243e, and 243h are installed in the gas supply pipes 232c, 232e, and 232h, respectively, sequentially from an upstream side of gas flow. Gas supply pipes 232d, 232f, 232g, and 232i are connected to the gas supply pipe 232b at a downstream side of the valve 243b. MFCs 241d, 241f, 241g, and 241i and valves 243d, 243f, 243g, and 243i are installed in the gas supply pipes 232d, 232f, 232g, and 232i, respectively, sequentially from an upstream side of gas flow.

The gas supply pipes 232a to 232i are made of a metal material containing iron (Fe) and nickel (Ni). The material of the gas supply pipes 232a to 232i may contain Fe, Ni, and chromium (Cr), or may contain Fe, Ni, Cr, and molybdenum (Mo). As the material of the gas supply pipes 232a to 232i may include, for example, Hastelloy® that has improved heat resistance and corrosion resistance by adding Fe, Mo, Cr, etc. to Ni or Inconel® that has improved heat resistance and corrosion resistance by adding Fe, Cr, niobium (Nb), Mo, etc. to Ni, or the like, as well as SUS. The material of the above-described manifold 209 and the material of a seal cap 219, a rotary shaft 255, and an exhaust pipe 231 to be described later can also be the same as that of the gas supply pipes 232a to 232i.

Figure 2:
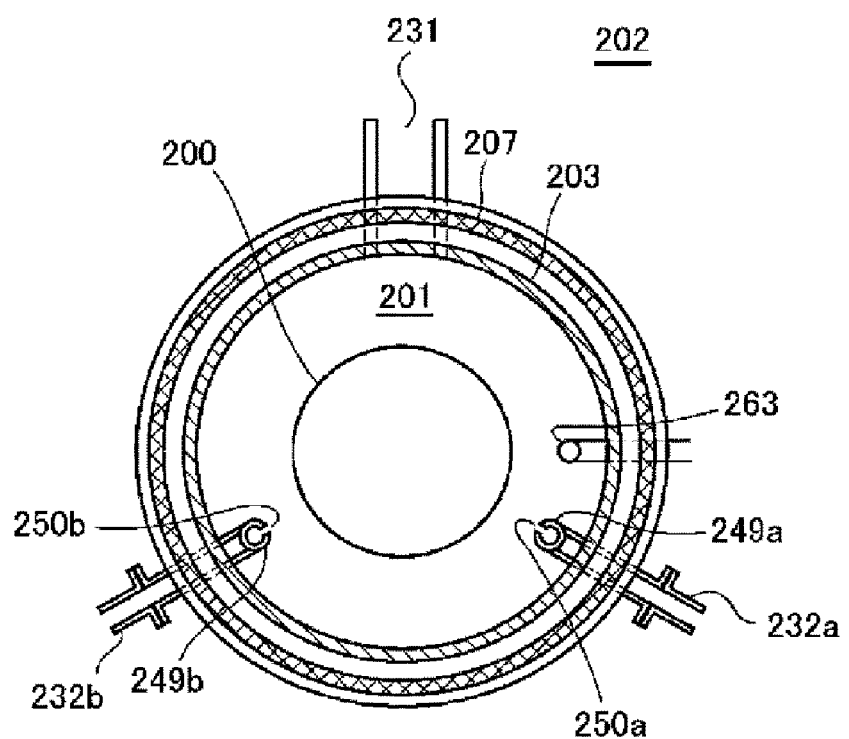
FIG. 2 is a schematic configuration view of the vertical process furnace of the substrate processing apparatus suitably used in the embodiments of the present disclosure, in which a portion of the process furnace is shown in a cross section taken along line A-A in FIG. 1.

As illustrated in FIG. 2, each of the nozzles 249a and 249b is disposed in an annular space (in a plane view) between an inner wall of the reaction tube 203 and the wafers 200 so as to extend upward along an arrangement direction of the wafers 200 from a lower portion of the inner wall of the reaction tube 203 to an upper portion thereof. Specifically, each of the nozzles 249a and 249b is installed in a region horizontally surrounding a wafer arrangement region, in which the wafers 200 are arranged, at a lateral side of the wafer arrangement region, along the wafer arrangement region. Gas supply holes 250a and 250b for supplying gas are formed on side surfaces of the nozzles 249a and 249b, respectively. Each of the gas supply holes 250a and 250b is opened toward the center of the wafers 200 in a plan view to allow the gas to be supplied toward the wafers 200. A plurality of gas supply holes 250a and 250b may be formed from a lower portion of the reaction tube 203 to an upper portion thereof.

A precursor gas, for example, a halosilane-based gas containing Si as a main element (predetermined element) constituting a film, and a halogen element, is supplied from the gas supply pipe 232a into the process chamber 201 via the MFC 241a, the valve 243a, and the nozzle 249a. The precursor gas refers to a gaseous precursor, for example, a precursor which remains in a gas state at room temperature and atmospheric pressure, or gas obtained by vaporizing a precursor which remains in a liquid state at room temperature and atmospheric pressure. The halosilane refers to silane including a halogen group. The halogen group includes a chloro group, a fluoro group, a bromo group, an iodo group, and the like. That is, the halogen group includes halogen elements such as chlorine (Cl), fluorine (F), bromine (Br), iodine (I), and the like. An example of the halosilane-based gas may include a precursor gas containing Si and Cl, that is, a chlorosilane-based gas. The chlorosilane-based gas acts as a Si source. An example of the chlorosilane-based gas may include a hexachlorodisilane ($Si_2Cl_6$, abbreviation: HCDS) gas. The HCDS gas is a gas containing an element (Si) which becomes solid alone under the above-described process conditions, that is, a gas capable of depositing a film alone under the above-described process conditions.

A reaction gas, for example, an oxygen (O)-containing gas, is supplied from the gas supply pipe 232b into the process chamber 201 via the MFC 241b, the valve 243b, and the nozzle 249b. An example of the O-containing gas may include oxygen ($O_2$) gas.

A reaction gas, for example, a carbon (C)-containing gas, is supplied from the gas supply pipe 232c into the process chamber 201 via the MFC 241c, the valve 243c, the gas supply pipe 232a, and the nozzle 249a. An example of the C-containing gas may include propylene ($C_3H_6$) gas which is a hydrocarbon-based gas.

A reaction gas, for example, a nitrogen (N)-and-hydrogen (H)-containing gas, is supplied from the gas supply pipe 232d into the process chamber 201 via the MFC 241d, the valve 243d, the gas supply pipe 232b, and the nozzle 249b. An example of the N- and H-containing gas may include ammonia ($NH_3$) gas which is a hydrogen nitride-based gas.

A fluorine (F)-containing gas is supplied from the gas supply pipes 232e and 232f into the process chamber 201 via the MFCs 241e and 241f, the valve 243e and 243f, the gas supply pipes 232a and 232b, and the nozzles 249a and 249b, respectively. The F-containing gas acts as a cleaning gas in each of chamber cleaning and nozzle cleaning to be described later. Further, the F-containing gas acts as a surface treatment gas in forming a F-containing layer to be described later. An example of the F-containing gas may include fluorine ($F_2$) gas.

An additive gas, for example, a nitrogen oxide-based gas, is supplied from the gas supply pipe 232g into the process chamber 201 via the MFC 241g, the valve 243g, the gas supply pipe 232b, and the nozzle 249b. The nitrogen oxide-based gas alone does not show a cleaning effect, but reacts with the F-containing gas in the chamber cleaning, which is to be described later, to generate active species such as fluorine radicals, a nitrosyl halogenide compound, and the like, and thus acts to improve the cleaning effect of the F-containing gas. An example of the nitrogen oxide-based gas may include nitrogen monoxide (NO) gas.

An inert gas, for example, nitrogen ($N_2$) gas, is supplied from the gas supply pipes 232h and 232i into the process chamber 201 via the MFCs 241h and 241i, the valves 243h and 243i, the gas supply pipes 232a and 232b, and the nozzles 249a and 249b, respectively. The $N_2$ gas acts as a purge gas, a carrier gas, a dilution gas, or the like.

A precursor gas supply system mainly includes the gas supply pipe 232a, the MFC 241a, the valve 243a, and the nozzle 249a. An O-containing gas supply system mainly includes the gas supply pipe 232b, the MFC 241b, the valve 243b, and the nozzle 249b. A C-containing gas supply system mainly includes the gas supply pipe 232c, the MFC 241c, the valve 243c, the gas supply pipe 232a, and the nozzle 249a. A N- and H-containing gas supply system mainly includes the gas supply pipe 232d, the MFC 241d, the valve 243d, the gas supply pipe 232b, and the nozzle 249b. A F-containing gas supply system mainly includes the gas supply pipes 232e and 232f, the MFCs 241e and 241f, and the valves 243e and 243f. The F-containing gas supply system may include the gas supply pipes 232a and 232b, and the nozzles 249a and 249b. An additive gas supply system mainly includes the gas supply pipe 232g, the MFC 241g, the valve 243g, the gas supply pipe 232b, and the nozzle 249b. An inert gas supply system mainly includes the gas supply pipes 232h and 232i, the MFCs 241h and 241i, the valves 243h and 243i, the gas supply pipes 232a and 232b, and the nozzles 249a and 249b.

One or all of the above-described various supply systems may be configured as an integrated-type supply system 248 in which the valves 243a to 243i, the MFCs 241a to 241i, and so on are integrated. The integrated-type supply system 248 is connected to each of the gas supply pipes 232a to 232i. In addition, the integrated-type supply system 248 may be configured such that operations of supplying various gases into the gas supply pipes 232a to 232i (that is, opening/closing operation of the valves 243a to 243i, flow rate adjustment operation by the MFCs 241a to 241i, and the like) are controlled by a controller 121 which will be described later. The integrated-type supply system 248 is configured as an integral type or detachable-type integrated unit, and may be attached to and detached from the gas supply pipes 232a to 232i and the like on an integrated unit basis, so that the maintenance, replacement, extension, etc. of the integrated-type supply system 248 can be performed on an integrated unit basis.

An exhaust port 231a for exhausting an internal atmosphere of the process chamber 201 is installed below a sidewall of the reaction tube 203. The exhaust port 231a may be installed from a lower portion of the sidewall of the reaction tube 203 to an upper portion thereof, that is, along the wafer arrangement region. An exhaust pipe 231 is connected to the exhaust port 231a. A vacuum exhaust device, e.g., a vacuum pump 246, is connected to the exhaust pipe 231 via a pressure sensor 245, which is a pressure detector (pressure detecting part) for detecting an internal pressure of the process chamber 201, and an auto pressure controller (APC) valve 244, which is a pressure regulator (pressure adjustment part). The APC valve 244 is configured to perform or stop a vacuum exhausting operation in the process chamber 201 by opening/closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

The seal cap 219, which serves as a furnace opening cover configured to hermetically seal a lower end opening of the manifold 209, is installed under the manifold 209. The seal cap 219 is made of, for example, a metal material such as stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed under the seal cap 219. A rotary shaft 255 of the rotation mechanism 267 is connected to the boat 217 through the seal cap 219. The rotation mechanism 267 is configured to rotate the wafers 200 by rotating the boat 217. The seal cap 219 is configured to be vertically moved up or down by a boat elevator 115 which is an elevating mechanism installed outside the reaction tube 203. The boat elevator 115 is configured as a transfer device (transfer mechanism) which loads/unloads (transfers) the wafers 200 into/out of the process chamber 201 by moving the seal cap 219 up or down. A shutter 219s, which serves as a furnace opening cover configured to hermetically seal a lower end opening of the manifold 209 in a state where the seal cap 219 is lowered and the boat 217 is unloaded from the process chamber 201, is installed under the manifold 209. The shutter 219s is made of, for example, a metal material such as stainless steel (SUS) or the like, and is formed in a disc shape. An O-ring 220c, which is a seal member making contact with the lower end portion of the manifold 209, is installed on an upper surface of the shutter 219s. The opening/closing operation (such as elevation operation, rotation operation, or the like) of the shutter 219s is controlled by a shutter-opening/closing mechanism 115s.

The boat 217 serving as a substrate support is configured to support the plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that an interior of the process chamber 201 has a desired temperature distribution. The temperature sensor 263 is installed along the inner wall of the reaction tube 203.

Figure 3:
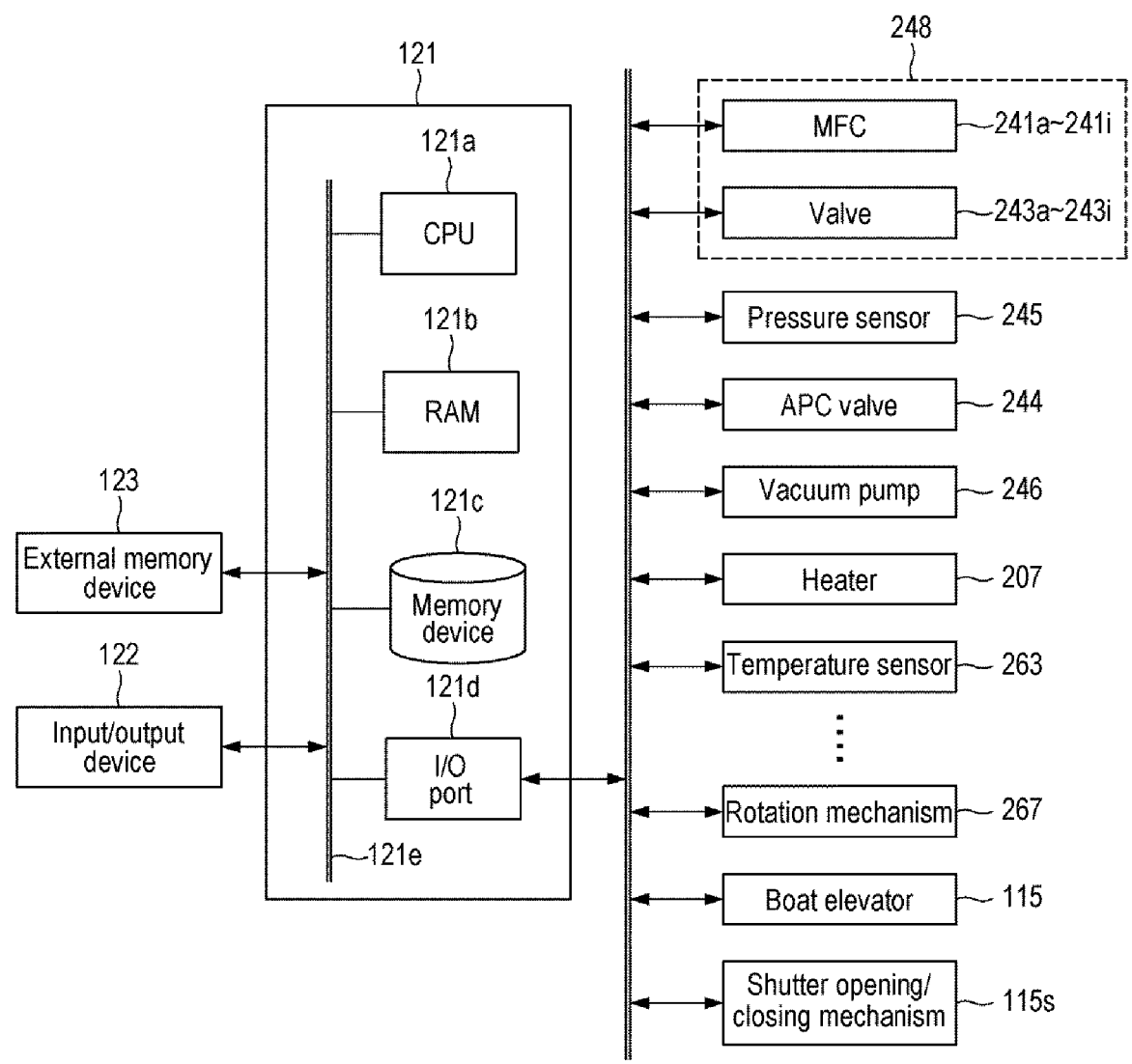
FIG. 3 is a schematic configuration diagram of a controller of the substrate processing apparatus suitably used in the embodiments of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 including, e.g., a touch panel or the like, is connected to the controller 121.

The memory device 121c is configured by, for example, a flash memory, a hard disk drive (HDD), or the like. A control program for controlling operations of a substrate processing apparatus, a process recipe in which sequences and conditions of film formation to be described later are written, and a cleaning-related recipe in which sequences and conditions of chamber cleaning, nozzle cleaning, and F-containing layer formation to be described later are written, are readably stored in the memory device 121c. The process recipe functions as a program for causing the controller 121 to execute each sequence in the film formation, which will be described later, to obtain an expected result. The cleaning-related recipe functions as a program for causing the controller 121 to execute each sequence in the chamber cleaning, the nozzle cleaning, and the F-containing layer formation, which will be described later, to obtain an expected result. Hereinafter, the process recipe, the cleaning-related recipe, and the control program may be generally and simply referred to as a "program." Furthermore, the process recipe and the cleaning-related recipe may be simply referred to as a "recipe." When the term "program" is used herein, it may indicate a case of including the recipe, a case of including the control program, or a case of including both the recipe and the control program. The RAM 121b is configured as a memory area (work area) in which a program, data, or so on read by the CPU 121a is temporarily stored.

The I/O port 121d is connected to the MFCs 241a to 241i, the valves 243a to 243i, the pressure sensor 245, the APC valve 244, the vacuum pump 246, the temperature sensor 263, the heater 207, the rotation mechanism 267, the boat elevator 115, the shutter-opening/closing mechanism 115s, and so on.

The CPU 121a is configured to read and execute the control program from the memory device 121c. The CPU 121a is also configured to read the recipe from the memory device 121c according to an input and so on of an operation command from the input/output device 122. In addition, the CPU 121a is configured to control the flow-rate-adjusting operation of various kinds of gases by the MFCs 241a to 241i, the opening/closing operation of the valves 243a to 243i, the opening/closing operation of the APC valve 244, the pressure-adjusting operation performed by the APC valve 244 based on the pressure sensor 245, the actuating and stopping of the vacuum pump 246, the temperature-adjusting operation performed by the heater 207 based on the temperature sensor 263, the operation of rotating the boat 217 with the rotation mechanism 267 and adjusting the rotation speed of the boat 217, the operation of moving the boat 217 up or down by the boat elevator 115, the opening/closing operation of the shutter 219s by the shutter-opening/closing mechanism 115s, and so on, according to contents of the read recipe.

The controller 121 may be configured by installing, on the computer, the aforementioned program stored in an external memory device 123 (for example, a magnetic disk such as a HDD, an optical disc such as a CD, a magneto-optical disc such as a MO, or a semiconductor memory such as a USB memory). The memory device 121c or the external memory device 123 is configured as a non-transitory computer-readable recording medium. Hereinafter, the memory device 121c and/or the external memory device 123 may be generally and simply referred to as a "recording medium." When the term "recording medium" is used herein, it may indicate a case of including the memory device 121c, a case of including the external memory device 123, or a case of including both the memory device 121c and the external memory device 123. Furthermore, the program may be provided to the computer using communication means such as the Internet or a dedicated line, instead of using the external memory device 123.

(2) Processing Process

As a process of manufacturing a semiconductor device using the above-described substrate processing apparatus, a processing sequence example of cleaning each of an interior of a process container and an interior of a first nozzle, forming a F-containing layer on an inner surface of a second pipe made of metal, and then forming a film on a substrate in the process container will be described mainly with reference to FIGS. 4 and 5. In the following descriptions, the operations of the respective parts constituting the substrate processing apparatus are controlled by the controller 121.

Figure 4:
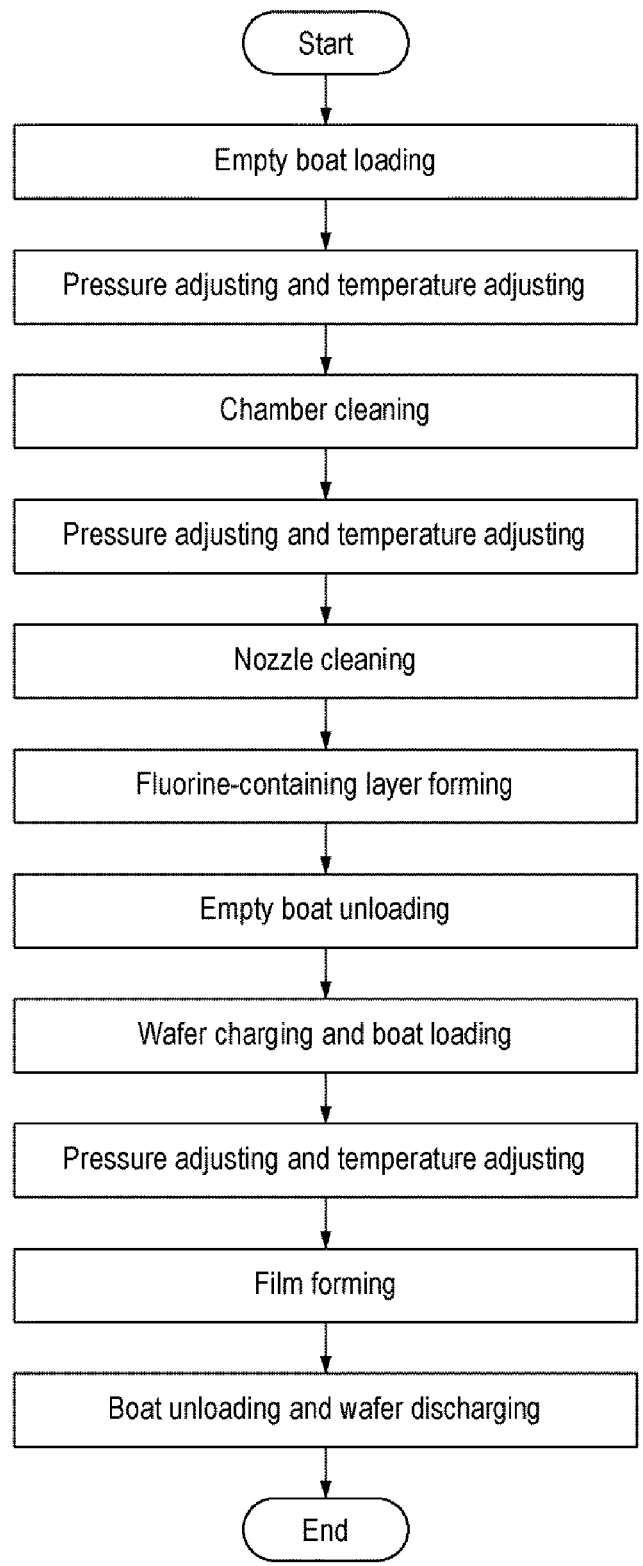
FIG. 4 is a diagram showing a substrate processing sequence according to the embodiments of the present disclosure.

The processing sequence shown in FIG. 4 includes an act of forming a film (film formation) on the wafer 200 as a substrate in a process container by performing a cycle a predetermined number of times, the cycle including: supplying the precursor gas from the gas supply pipe 232a as a first pipe made of metal and the nozzle 249a as a first nozzle to the wafer 200, supplying the O-containing gas from the gas supply pipe 232b as a second pipe made of metal and the nozzle 249b as a second nozzle to the wafer 200, and supplying the N- and H-containing gas from the gas supply pipe 232b and the nozzle 249b to the wafer 200; and forming a continuous F-containing layer (F-containing layer formation) on the inner surface of the gas supply pipe 232b by supplying $F_2$ gas as the F-containing gas into the gas supply pipe 232b to cause chemical reaction of the $F_2$ gas with the inner surface of the gas supply pipe 232b.

Figure 5:
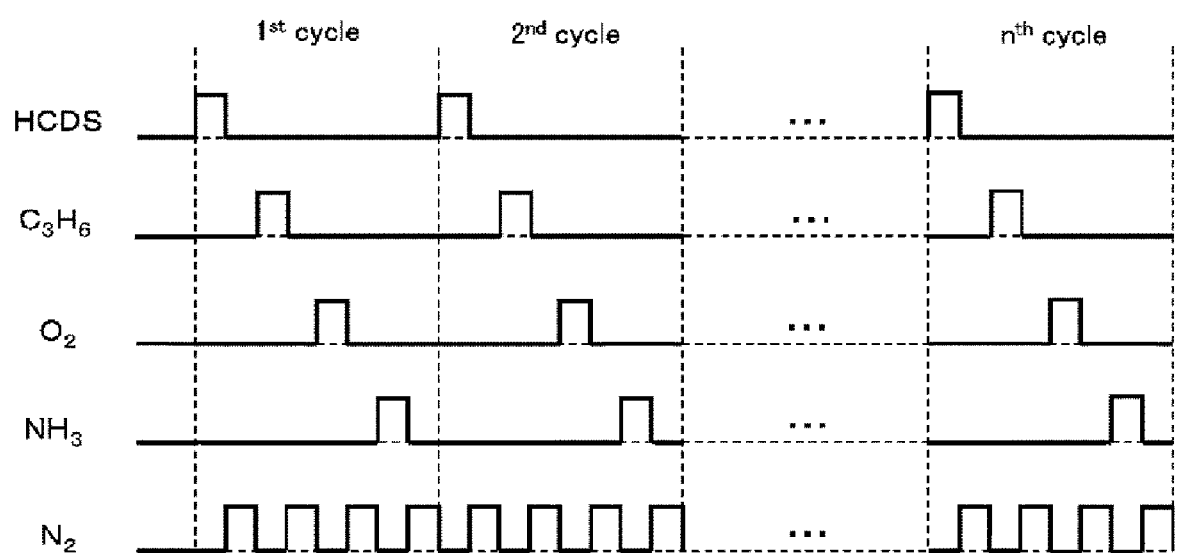
FIG. 5 is a diagram showing a gas supply sequence in film formation according to the embodiments of the present disclosure.

As shown by a gas supply sequence in FIG. 5, in the above-described film formation, a film containing Si, O, C, and N (that is, a silicon oxycarbonitride film (SiOCN film)) is formed as a film on the wafer 200 by performing a cycle a predetermined number of times (n times, n being an integer of 1 or larger), the cycle including non-simultaneously performing: act 1 of supplying HCDS gas as the precursor gas from the gas supply pipe 232a and the nozzle 249a to the wafer 200 in the process container, act 2 of supplying $C_3H_6$ gas as the C-containing gas from the gas supply pipe 232a and the nozzle 249a to the wafer 200 in the process container, act 3 of supplying $O_2$ gas as the O-containing gas from the gas supply pipe 232b and the nozzle 249b to the wafer 200 in the process container, and act 4 of supplying $NH_3$ gas as the N- and H-containing gas from the gas supply pipe 232b and the nozzle 249b to the wafer 200 in the process container.

In the present disclosure, for the sake of convenience, the gas supply sequence shown in FIG. 5 may be denoted as follows. The same denotation may be used in other embodiments to be described later.

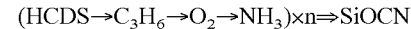

(HCDS→$C_3H_6$→$O_2$→$NH_3$)×n⇒SiOCN

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer formed on a wafer". When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Empty Boat Loading)

The shutter 219s is moved by the shutter-opening/closing mechanism 115s and the lower end opening of the manifold 209 is opened (shutter open). Thereafter, the empty boat 217, that is, the boat 217 not charged with the wafers 200, is lifted up by the boat elevator 115 to be loaded into the process chamber 201. In this state, the seal cap 219 seals the lower end of the manifold 209 through the O-ring 220b.

(Pressure Adjusting and Temperature Adjusting)

After the boat 217 is loaded into the process chamber 201, the interior of the process chamber 201 is vacuum-exhausted by the vacuum pump 246 to reach a desired pressure (chamber cleaning pressure). In addition, the interior of the process chamber 201 is heated by the heater 207 to a desired temperature (chamber cleaning temperature). In this operation, members in the process chamber 201, that is, the inner wall of the reaction tube 203, the surfaces of the nozzles 249a and 249b, the surface of the boat 217, and so on, are also heated to the chamber cleaning temperature. Further, the rotation of the boat 217 by the rotation mechanism 267 is started. The operation of the vacuum pump 246, the heating of the interior of the process chamber 201, and the rotation of the boat 217 are continuously performed at least until nozzle cleaning or F-containing layer formation to be described later are completed. The boat 217 may not be rotated.

(Chamber Cleaning)

After the internal pressure and temperature of the process chamber 201 are stabilized, the interior of the process chamber 201 is cleaned by supplying $F_2$ gas and NO gas into the process chamber 201. Specifically, the valves 243e and 243g are opened to allow the $F_2$ gas and the NO gas to flow through the gas supply pipes 232e and 232g, respectively. The flow rates of the $F_2$ gas and the NO gas are adjusted by the MFCs 241e and 241g, respectively, and then the $F_2$ gas and the NO gas are supplied into the process chamber 201 via the gas supply pipes 232a and 232b and the nozzles 249a and 249b, respectively, and are exhausted through the exhaust port 231a. In this operation, the valves 243h and 243i may be simultaneously opened to supply a $N_2$ gas into the process chamber 201 via the nozzles 249a and 249b.

The process conditions in this step are exemplified as follows.

$F_2$ gas supply flow rate: 0.5 to 10 slm
NO gas supply flow rate: 0.5 to 10 slm
$N_2$ gas supply flow rate (for each gas supply pipe): 0 to 10 slm
Gas supply time: 1 to 60 minutes, specifically 10 to 20 minutes
Processing temperature (chamber cleaning temperature): 100 to 350 degrees C., specifically 200 to 300 degrees C.
Processing pressure (chamber cleaning pressure): 1,333 to 53,329 Pa, specifically 9,000 to 16,665 Pa In the present disclosure, the notation of a numerical range such as "100 to 350 degrees C." means that the lower limit value and the upper limit value are included in the range. For example, "100 to 350 degrees C." means "equal to or higher than 100 degrees C. and equal to or lower than 350 degrees C.". The same applies to other numerical ranges.

By supplying the $F_2$ gas and the NO gas into the process chamber 201 under the aforementioned processing conditions, the NO gas can be added to the $F_2$ gas, and these gases can be mixed and react in the process chamber 201. This reaction makes it possible to generate, for example, active species such as fluorine radicals (F*) and nitrosyl fluoride (FNO) (hereinafter, collectively referred to as FNO or the like) in the process chamber 201. As a result, a mixed gas obtained by adding the FNO or the like to the $F_2$ gas exists in the process chamber 201. The mixed gas obtained by adding the FNO or the like to the $F_2$ gas contacts the members in the process chamber 201, for example, the inner wall of the reaction tube 203, the surfaces of the nozzles 249a and 249b, the surface of the boat 217, and the like. In this operation, the deposits adhered to the surfaces of the members in the process chamber 201 can be removed by the thermochemical reaction (etching reaction). The FNO or the like acts to promote the etching reaction by the $F_2$ gas to increase the etching rate of the deposits, that is, to assist the etching.

After a predetermined time has passed and the cleaning of the interior of the process chamber 201 is completed, the valves 243e and 243g are closed to stop the supply of the $F_2$ gas and the NO gas into the process chamber 201. Then, the interior of the process chamber 201 is vacuum-exhausted, and gas and the like remaining in the process chamber 201 are excluded from the interior of the process chamber 201 (purge). In this operation, the valves 243h and 243i are opened to supply $N_2$ gas into the process chamber 201. The $N_2$ gas acts as a purge gas.

As the cleaning gas (F-containing gas), it may be possible to use, e.g., hydrogen fluoride (HF) gas, nitrogen fluoride ($NF_3$) gas, chlorine fluoride ($ClF_3$) gas, or a mixed gas thereof, as well as the $F_2$ gas. The same applies to the nozzle cleaning which will be described later.

As the additive gas, it may be possible to use, e.g., hydrogen ($H_2$) gas, $O_2$ gas, nitrous oxide ($N_2O$) gas, isopropyl alcohol (($CH_3)_2CHOH$, abbreviation: IPA) gas, methanol ($CH_3OH$) gas, water vapor ($H_2O$ gas), HF gas, or a mixed gas thereof, as well as the NO gas.

When the HF gas is used as the additive gas, one of the $F_2$ gas, the $ClF_3$ gas, the $NF_3$ gas, and the mixed gas thereof may be used as the cleaning gas. Further, when the HF gas is used as the cleaning gas, and one of the IPA gas, the methanol gas, the $H_2O$ gas, and the mixed gas thereof is used as the additive gas, the above-mentioned processing temperature may be set to a predetermined temperature within a range of, for example, 30 to 300 degrees C., specifically 50 to 200 degrees C.

As the inert gas, it may be possible to use, e.g., a rare gas such as Ar gas, He gas, Ne gas, Xe gas, or the like, as well as the $N_2$ gas. The same applies to each step which will be described later.

(Pressure Adjusting and Temperature Adjusting)

After the chamber cleaning is completed, the interior of the process chamber 201 is vacuum-exhausted by the vacuum pump 246 to reach a desired pressure (nozzle cleaning pressure). In addition, the interior of the nozzle 249a is heated by the heater 207 to a desired temperature (nozzle cleaning temperature).

(Nozzle Cleaning)

After the internal pressure of the process chamber 201 and the internal temperature of the nozzle 249a are stabilized, the interior of the nozzle 249a is cleaned by supplying $F_2$ gas into the nozzle 249a. Specifically, the valve 243e is opened to allow the $F_2$ gas to flow through the gas supply pipe 232e. The flow rate of the $F_2$ gas is adjusted by the MFC 241e, and then the $F_2$ gas is supplied into the nozzle 249a via the gas supply pipe 232a and flown into the process chamber 201 and is exhausted through the exhaust port 231a. In this operation, the valves 243h and 243i may be simultaneously opened to supply $N_2$ gas into the process chamber 201 via the nozzles 249a and 249b.

The process conditions in this step are exemplified as follows.

$F_2$ gas supply flow rate: 0.5 to 10 slm
$N_2$ gas supply flow rate (for each gas supply pipe): 0 to 10 slm
Gas supply time: 1 to 60 minutes, specifically 10 to 20 minutes
Processing temperature (nozzle cleaning temperature): 400 to 500 degrees C., specifically 400 to 450 degrees C.
Processing pressure (nozzle cleaning pressure): 1,333 to 40,000 Pa, specifically 6,666 to 16,665 Pa By supplying the $F_2$ gas into the nozzle 249a under the aforementioned processing conditions, deposits adhered to the interior of the nozzle 249a can be removed by the thermochemical reaction. After a predetermined time has passed and the cleaning of the interior of the nozzle 249a is completed, the valve 243e is closed to stop the supply of the $F_2$ gas into the nozzle 249a. Then, the interior of the process chamber 201 is vacuum-exhausted, and gas and the like remaining in the process chamber 201 are excluded from the interior of the process chamber 201 (purge). In this operation, the valves 243h and 243i are opened to supply $N_2$ gas into the process chamber 201. The $N_2$ gas acts as a purge gas.

(F-Containing Layer Forming)

After the nozzle cleaning is completed, the inner wall of the gas supply pipe 232b is surface-treated by supplying $F_2$ gas into the gas supply pipe 232b. That is, the $F_2$ gas and the inner surface of the gas supply pipe 232b chemically react with each other to form a continuous F-containing layer on the inner surface of the gas supply pipe 232b.

Specifically, the valve 243f is opened to allow the $F_2$ gas to flow through the gas supply pipe 232f. The flow rate of the $F_2$ gas is adjusted by the MFC 241f, and then the $F_2$ gas is supplied into the gas supply pipe 232b and flown into the process chamber 201 via the nozzle 249b and is exhausted through the exhaust port 231a. In this operation, the valves 243h and 243i may be simultaneously opened to supply $N_2$ gas into the process chamber 201 via the nozzles 249a and 249b.

The process conditions in this step are exemplified as follows.

$F_2$ gas supply flow rate: 0.5 to 10 slm
$N_2$ gas supply flow rate (for each gas supply pipe): 0 to 10 slm
$F_2$ gas supply time: 75 to 300 minutes, specifically 150 to 300 minutes, more specifically 150 to 225 minutes
Temperature of gas supply pipe 232b: room temperature (25 degrees C.) to 150 degrees C.
The other process conditions may be the same as the process conditions in the nozzle cleaning.

By supplying $F_2$ gas into the gas supply pipe 232b under the aforementioned processing conditions, the $F_2$ gas and the inner surface of the gas supply pipe 232b chemically react with each other, thereby making it possible to form a continuous F-containing layer on the inner surface of the gas supply pipe 232b. The F-containing layer includes a metal fluoride layer formed by fluorinating metal that is a material of the gas supply pipe 232b. Thus, the inner surface of the gas supply pipe 232b can be covered with the F-containing layer to thereby prevent the material of the gas supply pipe 232b from being exposed in the gas supply pipe 232b. In the film formation to be described later, an O-containing gas such as $O_2$ gas and a N- and H-containing gas such as $NH_3$ gas may react with each other in the gas supply pipe 232b to generate water ($H_2O$). In some cases, the generated water reacts with the $NH_3$ gas to generate ammonia water ($NH_4OH$) in the gas supply pipe 232b. The ammonia water may corrode the material of the gas supply pipe 232b, which causes damage to the gas supply pipe 232b. In this embodiment, by forming the continuous F-containing layer on the inner surface of the gas supply pipe 232b in advance prior to performing the film formation, it is possible to prevent the inner surface of the gas supply pipe 232b from being corroded (and damaged).

If the supply time of the $F_2$ gas is shorter than 75 minutes, the above-described corrosion prevention effect of the F-containing layer on the inner surface of the gas supply pipe 232b may be insufficient. By setting the supply time of the $F_2$ gas to 75 minutes or more, it is possible to sufficiently enhance the corrosion prevention effect of the F-containing layer on the inner surface of the gas supply pipe 232b. By setting the supply time of the $F_2$ gas to 150 minutes or longer, it is possible to remarkably enhance the corrosion prevention effect of the F-containing layer on the inner surface of the gas supply pipe 232b. If the supply time of the $F_2$ gas is excessively long, for example, if the supply time exceeds 300 minutes, corrosion of the inner surface of the gas supply pipe 232b by the $F_2$ gas proceeds, which may result in cracks or peeling-off in the F-containing layer. By setting the supply time of the $F_2$ gas to 300 minutes or shorter, it is possible to prevent the occurrence of cracks and peeling-off in the F-containing layer due to the progress of corrosion of the inner surface of the gas supply pipe 232b by the $F_2$ gas. By setting the supply time of the $F_2$ gas to 225 minutes or shorter, this effect can be reliably obtained. Therefore, the supply time of the $F_2$ gas may be set to 75 minutes to 300 minutes, specifically 150 minutes to 300 minutes, more specifically 150 minutes to 225 minutes.

In addition, the thickness of the F-containing layer formed in this step may be set to a thickness that the ammonia water and the inner surface of the gas supply pipe 232b do not chemically react with each other in the gas supply pipe 232b. Specifically, the thickness of the F-containing layer may be set to a thickness within a range of, for example, 1 nm to 50 nm, specifically 2 nm to 35 nm.

In addition, the $F_2$ gas supply time in this step may be longer than the $F_2$ gas supply time in the chamber cleaning, and may be longer than the $F_2$ gas supply time in the nozzle cleaning. That is, the $F_2$ gas supply time in this step may be longer than both the $F_2$ gas supply time in the chamber cleaning and the $F_2$ gas supply time in the nozzle cleaning. By doing in this way, it is possible to reliably make the F-containing layer a continuous layer and to reliably prevent corrosion of the inner surface of gas supply pipe 232b in the film formation to be described later. Furthermore, the $F_2$ gas supply time in this step may be longer than the total time of the $F_2$ gas supply time in the chamber cleaning and the $F_2$ gas supply time in the nozzle cleaning. As the $F_2$ gas supply time in this step is increased, it is possible to more reliably make the F-containing layer a continuous layer and to more reliably prevent corrosion of the inner surface of the gas supply pipe 232b in the film formation to be described later. However, as described above, if the $F_2$ gas supply time is excessively long, corrosion of the inner surface of the gas supply pipe 232b by the $F_2$ gas proceeds, which may result in cracks or peeling-off in the F-containing layer.

In addition, the temperature of the gas supply pipe 232b in this step may be lower than the temperature of the gas supply pipe 232b in the film formation to be described later (a temperature for preventing byproduct adhesion), and may be within the above-described temperature range, that is, room temperature (25 degrees C.) to 150 degrees C. This makes it possible to avoid the progress of corrosion of the inner surface of the gas supply pipe 232b by the $F_2$ gas.

In this step, since the $F_2$ gas supplied into the gas supply pipe 232b also flows into the nozzle 249b, the deposits in the nozzle 249b can be removed by a thermochemical reaction as in the nozzle cleaning.

After the formation of the F-containing layer is completed, the interior of the process chamber 201 is purged (purge) according to the same processing procedure as the purge in the above-described chamber cleaning. Thereafter, the internal atmosphere of the process chamber 201 is substituted with an inert gas (inert gas substitution) and the internal pressure of the process chamber 201 is returned to the atmospheric pressure (returning to atmospheric pressure).

(Empty Boat Unloading)

The seal cap 219 is moved down by the boat elevator 115 to open the lower end of the manifold 209. Then, the empty boat 217 is unloaded from the lower end of the manifold 209 to the outside of the reaction tube 203 (boat unloading). After the boat unloading, the shutter 219s is moved, and the lower end opening of the manifold 209 is sealed by the shutter 219s through the O-ring 220c (shutter closing).

In addition, prior to performing the boat unloading, a process for the wafers 200, that is, the same process as the film-forming process, may be performed in the process container according to the same process procedure and process conditions as the film formation to be described later (pre-coating). By performing the pre-coating, a pre-coating film (SiCON film) containing Si, O, C, and N can be formed on the surfaces of the members in the process container. The pre-coating may be performed, for example, in a state where the cleaned empty boat 217 is accommodated in the process container.

(Wafer Charging and Boat Loading)

After the boat unloading is completed, when the boat 217 is charged with a plurality of wafers 200 (wafer charging), the shutter 219s is moved by the shutter-opening/closing mechanism 115s and the lower end opening of the manifold 209 is opened (shutter open). Thereafter, as shown in FIG. 1, the boat 217 charged with the wafers 200 is lifted up by the boat elevator 115 to be loaded into the process chamber 201 (boat loading). In this state, the seal cap 219 seals the lower end of the manifold 209 through the O-ring 220b.

(Pressure Adjusting and Temperature Adjusting)

The interior of the process chamber 201, namely, a space in which the wafers 200 are placed, is vacuum-exhausted (depressurization-exhausted) by the vacuum pump 246 to reach a desired pressure (film formation pressure). In addition, the wafers 200 in the process chamber 201 are heated by the heater 207 to a desired temperature (film formation temperature). Then, the rotation of the wafers 200 by the rotation mechanism 267 is initiated. Exhausting the interior of the process chamber 201 and heating and rotating the wafers 200 may be continuously performed at least until processing for the wafers 200 is completed.

(Film Forming)

Thereafter, the following steps 1 to 4 are performed in a sequential manner.

[Step 1]

In this step, HCDS gas is supplied to the wafer 200 in the process container (HCDS gas supplying). Specifically, the valve 243a is opened to allow the HCDS gas to flow through the gas supply pipe 232a. The flow rate of the HCDS gas is adjusted by the MFC 241a and then the HCDS gas is supplied into the process chamber 201 via the nozzle 249a and is exhausted through the exhaust port 231a. In this operation, the HCDS gas is supplied to the wafer 200. In this operation, the valves 243h and 243i may be opened to supply $N_2$ gas into the process chamber 201 via the nozzles 249a and 249b.

The process conditions in this step are exemplified as follows.

HCDS gas supply flow rate: 0.01 to 2 slm, specifically 0.1 to 1 slm $N_2$ gas supply flow rate (for each gas supply pipe): 0 to 10 slm Gas supply time: 1 to 120 seconds, specifically 1 to 60 seconds Processing temperature: 250 to 800 degrees C., specifically 400 to 700 degrees C.

Processing pressure: 1 to 2,666 Pa, specifically 67 to 1,333 Pa

By supplying the HCDS gas to the wafer 200 under the aforementioned conditions, a Si-containing layer containing Cl is formed as a first layer on an outermost surface of the wafer 200. The Si-containing layer containing Cl is formed when HCDS is physically adsorbed on the outermost surface of the wafer 200, when a substance (hereinafter, $Si_xCl_y$), into which HCDS is partially decomposed, is chemically adsorbed thereon, or when Si is deposited thereon by thermal decomposition of HCDS. The Si-containing layer containing Cl may be an adsorption layer (physical adsorption layer or chemical adsorption layer) of HCDS or $Si_xCl_y$, or may be a Si deposition layer containing Cl. In the present disclosure, a Si-containing layer containing Cl is simply referred to as a Si-containing layer.

After the first layer is formed, the valve 243a is closed to stop the supply of the HCDS gas into the process chamber 201. Then, the interior of the process chamber 201 is vacuum-exhausted, and gas and the like remaining in the process chamber 201 are excluded from the interior of the process chamber 201 (purge). In this operation, the valves 243h and 243i are opened to supply $N_2$ gas into the process chamber 201. The $N_2$ gas acts as a purge gas.

As a precursor gas, it may be possible to use, e.g., chlorosilane-based gases such as monochlorosilane ($SiH_3Cl$, abbreviation: MCS) gas, dichlorosilane ($SiH_2Cl_2$, abbreviation: DCS) gas, trichlorosilane ($SiHCl_3$, abbreviation: TCS) gas, tetrachlorosilane ($SiCl_4$, abbreviation: STC) gas, octachlorotrisilane ($Si_3Cl_8$, abbreviation: OCTS) gas, and the like, as well as the HCDS gas.

[Step 2]

After Step 1 is completed, $C_3H_6$ gas is supplied to the wafer 200 in the process container, specifically, the first layer formed the wafer 200 ($C_3H_6$ gas supplying). Specifically, the valve 243c is opened to allow the $C_3H_6$ gas to flow through the gas supply pipe 232c. The flow rate of the $C_3H_6$ gas is adjusted by the MFC 241c and then the $C_3H_6$ gas is supplied into the process chamber 201 via the gas supply pipe 232a and the nozzle 249a and is exhausted through the exhaust port 231a. In this operation, the $C_3H_6$ gas is supplied to the wafer 200. In this operation, the valves 243h and 243i may be opened to supply a $N_2$ gas into the process chamber 201 via the nozzles 249a and 249b.

The process conditions in this step are exemplified as follows.

$C_3H_6$ gas supply flow rate: 0.1 to 10 slm $C_3H_6$ gas supply time: 1 to 120 seconds, specifically 1 to 60 seconds Processing pressure: 1 to 4,000 Pa, specifically 1 to 3,000 Pa The other process conditions are the same as the process conditions in Step 1.

By supplying the $C_3H_6$ gas to the wafer 200 under the aforementioned conditions, a C-containing layer is formed on the first layer, whereby a second layer containing Si and C is formed on the wafer 200.

After the second layer is formed, the valve 243c is closed to stop the supply of the $C_3H_6$ gas into the process chamber 201. Then, a gas and the like remaining in the process chamber 201 are excluded from the interior of the process chamber 201 according to the same process procedure as the purge in Step 1 (purge).

As a reaction gas (C-containing gas), it may be possible to use, e.g., hydrocarbon-based gases such as acetylene ($C_2H_2$) gas, ethylene ($C_2H_4$) gas and the like, as well as the $C_3H_6$ gas.

[Step 3]

After Step 2 is completed, $O_2$ gas is supplied to the wafer 200 in the process container, specifically, the second layer formed the wafer 200 ($O_2$ gas supplying). Specifically, the valve 243b is opened to allow the $O_2$ gas to flow through the gas supply pipe 232b. The flow rate of the $O_2$ gas is adjusted by the MFC 241b and then the $O_2$ gas is supplied into the process chamber 201 via the nozzle 249b and is exhausted through the exhaust port 231a. In this operation, the $O_2$ gas is supplied to the wafer 200. In this operation, the valves 243h and 243i may be opened to supply $N_2$ gas into the process chamber 201 via the nozzles 249a and 249b.

The process conditions in this step are exemplified as follows.

O$_2$ gas supply flow rate: 0.1 to 10 slm
O$_2$ gas supply time: 1 to 120 seconds, specifically 1 to 60 seconds
Processing pressure: 1 to 4,000 Pa, specifically 1 to 3,000 Pa
The other process conditions are the same as the process conditions in Step 1.

By supplying the O$_2$ gas to the wafer 200 under the aforementioned conditions, at least a portion of the second layer formed on the wafer 200 is oxidized (modified). As the second layer is modified, a third layer containing Si, O, and C, that is, a silicon oxycarbide layer (SiOC layer), is formed on the wafer 200. As the third layer is formed, impurities such as Cl contained in the second layer constitute a gaseous substance containing at least Cl in the process of the modifying reaction of the second layer by the O$_2$ gas, and are discharged out of the process chamber 201. As a result, the third layer becomes a layer having fewer impurities such as Cl and the like than the second layer.

After the third layer is formed, the valve 243b is closed to stop the supply of the O$_2$ gas into the process chamber 201. Then, gas and the like remaining in the process chamber 201 are excluded from the interior of the process chamber 201 according to the same process procedure as the purge in Step 1 (purge).

As a reaction gas (O-containing gas), it may be possible to use, e.g., ozone (O$_3$) gas, water vapor (H$_2$O gas), nitric oxide (NO) gas, nitrous oxide (N$_2$O) gas, or the like, as well as the O$_2$ gas.

[Step 4]

After Step 3 is completed, NH$_3$ gas is supplied to the wafer 200 in the process container, specifically, the third layer formed the wafer 200 (NH$_3$ gas supplying). Specifically, the valve 243d is opened to allow the NH$_3$ gas to flow through the gas supply pipe 232d. The flow rate of the NH$_3$ gas is adjusted by the MFC 241d and then the NH$_3$ gas is supplied into the process chamber 201 via the gas supply pipe 232b the nozzle 249b and is exhausted through the exhaust port 231a. In this operation, the NH$_3$ gas is supplied to the wafer 200. In this operation, the valves 243h and 243i may be opened to supply a N$_2$ gas into the process chamber 201 via the nozzles 249a and 249b.

The process conditions in this step are exemplified as follows.

NH$_3$ gas supply flow rate: 0.1 to 10 slm
NH$_3$ gas supply time: 1 to 120 seconds, specifically 1 to 60 seconds
Processing pressure: 1 to 4,000 Pa, specifically 1 to 3,000 Pa
The other process conditions are the same as the process conditions in Step 1.

By supplying the NH$_3$ gas to the wafer 200 under the aforementioned conditions, at least a portion of the third layer formed on the wafer 200 is nitrided (modified). As the third layer is modified, a fourth layer containing Si, O, C, and N, that is, a silicon oxycarbonitride layer (SiOCN layer), is formed on the wafer 200. As the fourth layer is formed, impurities such as Cl contained in the third layer constitute a gaseous substance containing at least Cl in the process of the modifying reaction of the third layer by the NH$_3$ gas, and are discharged out of the process chamber 201. As a result, the fourth layer becomes a layer having fewer impurities such as Cl and the like than the third layer.

After the fourth layer is formed, the valve 243d is closed to stop the supply of the NH$_3$ gas into the process chamber 201. Then, gas and the like remaining in the process chamber 201 are excluded from the interior of the process chamber 201 according to the same process procedure as the purge in Step 1 (purge).

As a reaction gas (N- and H-containing gas), it may be possible to use, e.g., hydrogen nitride-based gases such as diazene (N$_2$H$_2$) gas, hydrazine (N$_2$H$_4$) gas, N$_3$H$_8$ gas and the like, as well as the NH$_3$ gas.

(Performing Predetermined Number of Times)

A cycle that non-simultaneously (i.e., asynchronously) performs the above-described Steps 1 to 4 is performed a predetermined number of times (n times, n being an integer of 1 or larger) to thereby form a SiOCN film having a predetermined composition and a predetermined film thickness on the wafer 200. This cycle may be repeated multiple times. That is, the thickness of the fourth layer formed per one cycle may be set to be smaller than a desired film thickness. Thus, the above cycle may be repeated a plurality of times until the film thickness of a SiOCN film formed by laminating the fourth layers becomes equal to the desired film thickness.

(After-Purging and Returning to Atmospheric Pressure)

After the film formation is completed, N$_2$ gas as a purge gas is supplied into the process chamber 201 from each of the nozzles 249a and 249b and is exhausted through the exhaust port 231a. Thus, the interior of the process chamber 201 is purged and the residual gas and the reaction byproducts remaining in the process chamber 201 are removed from the interior of the process chamber 201 (after-purging). Thereafter, the internal atmosphere of the process chamber 201 is substituted with an inert gas (inert gas substitution) and the internal pressure of the process chamber 201 is returned to the atmospheric pressure (returning to atmospheric pressure).

(Boat Unloading and Wafer Discharging)

The seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219s is moved, and the lower end opening of the manifold 209 is sealed by the shutter 219s through the O-ring 220c (shutter closing). After being unloaded from the reaction tube 203, the processed wafers 200 are discharged from the boat 217 (wafer discharging).

(3) Effects of the Present Embodiment

According to the present embodiment, one or more effects set forth below may be achieved.

(a) By forming the F-containing layer prior to performing the film formation, it is possible to improve the film quality of the SiOCN film formed on the wafer 200, that is, the quality of the film-forming process.

Figure 6A:
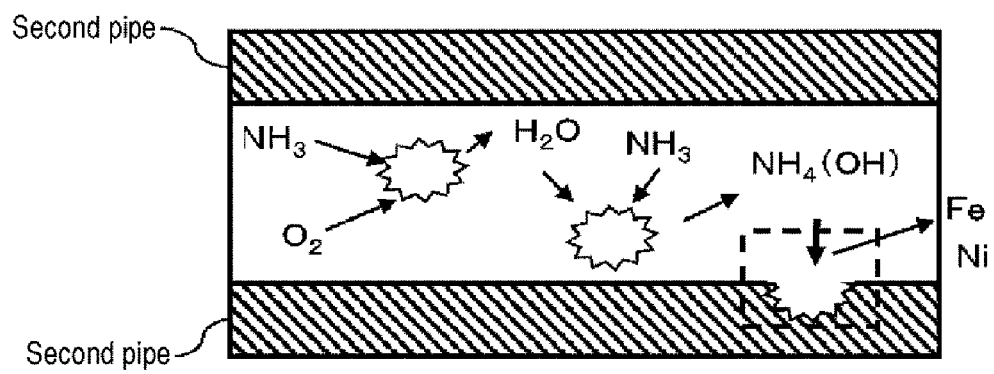
FIG. 6A is a schematic sectional view showing a reaction generated in a second pipe made of metal, in which a fluorine-containing layer is not formed on the inner surface of the second pipe.

This is because, as described above, when the above-described film formation is performed, the O$_2$ gas remaining in the gas supply pipe 232b at the start of Step 4 and the NH$_3$ gas supplied into the gas supply pipe 232b by performing Step 4 may react with each other to generate water (H$_2$O) in the gas supply pipe 232b. In addition, this water and the NH$_3$ gas may react with each other to generate ammonia water (NH$_4$OH) or the like in the gas supply pipe 232b. The ammonia water generated in the gas supply pipe 232b is a factor to corrode the inner surface of the gas supply pipe 232b and generate foreign substances (metal particles, hereinafter also simply referred to as particles) containing Fe or Ni in the gas supply pipe 232b. The state of this reaction is shown in FIG. 6A. The particles generated in the gas supply pipe 232b may diffuse into the process chamber 201 and be adsorbed on the surface of the wafer 200, thereby deteriorating the quality of the SiOCN film formed on the wafer 200.

Figure 6B:
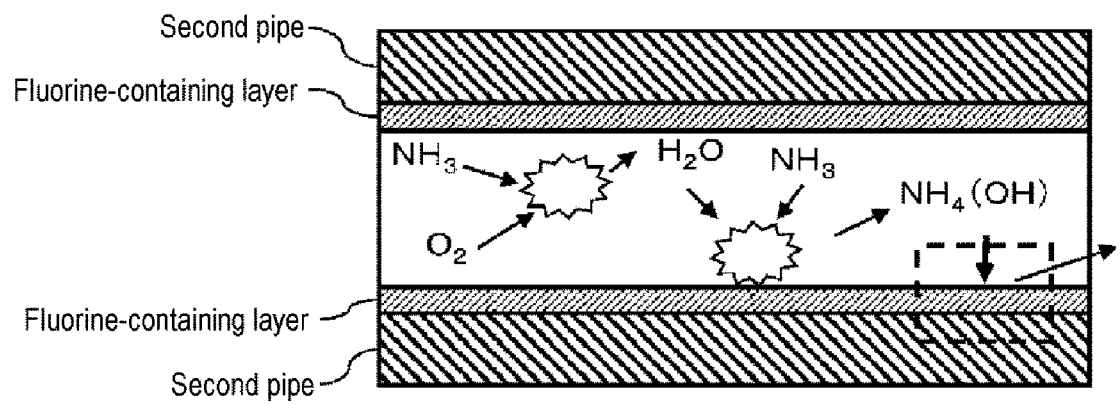
FIG. 6B is a schematic sectional view showing a reaction generated in a second pipe made of metal, in which a fluorine-containing layer is formed on the inner surface of the second pipe.

In contrast, in this embodiment, the F-containing layer formation is performed prior to performing the film formation, and the F-containing layer is formed on the inner surface of the gas supply pipe 232b. The F-containing layer formed on the inner surface of the gas supply pipe 232b functions as a so-called passivation layer or acts like the passivation layer. Due to the action of the F-containing layer, even when the ammonia water is generated in the gas supply pipe 232b, it is possible to prevent corrosion of the inner surface of the gas supply pipe 232b. The state of this reaction is shown in FIG. 6B. Thereby, it is possible to prevent occurrence of particles in the gas supply pipe 232b. As a result, it is possible to improve the quality of the SiOCN film formed on the wafer 200.

(b) In this embodiment, by making the F-containing layer a continuous layer and preventing the material of the gas supply pipe 232b from being exposed in the gas supply pipe 232b, it is possible to reliably prevent corrosion of the inner surface of the gas supply pipe 232b. As a result, it is possible to reliably improve the quality of the film-forming process.

(c) By setting the thickness of the F-containing layer to a thickness that the ammonia water generated in the gas supply pipe 232b and the inner surface of the gas supply pipe 232b do not chemically react with each other, it is possible to more reliably prevent corrosion of the inner surface of the gas supply pipe 232b. As a result, it is possible to further reliably improve the quality of the film-forming process.

If the thickness of the F-containing layer is less than 1 nm, the inner surface of the gas supply pipe 232b may be corroded by chemical reaction with the ammonia water. By setting the thickness of the F-containing layer to 1 nm or greater, it is possible to avoid corrosion of the inner surface of the gas supply pipe 232b due to the chemical reaction with the ammonia water. This effect can be reliably obtained by setting the thickness of the F-containing layer to 2 nm or greater. If the thickness of the F-containing layer exceeds 50 nm, the corrosion of the inner surface of the gas supply pipe 232b by the $F_2$ gas proceeds, which may result in cracks and peeling-off in the F-containing layer. By setting the thickness of the F-containing layer to 50 nm or smaller, it is possible to prevent occurrence of cracks and peeling-off in the F-containing layer due to the corrosion of the inner surface of the gas supply pipe 232b by the $F_2$ gas. By setting the thickness of the F-containing layer to 35 nm or smaller, this effect can be reliably obtained.

(d) By performing the chamber cleaning and the F-containing layer forming prior to performing the film formation, it is possible to further increase the cleanliness of the interior of the process container and to further improve the quality of the film-forming process performed in the process chamber 201. Further, as in this embodiment, by performing the chamber cleaning and the F-containing layer forming in this order prior to performing the film formation, it is possible to reduce the time required for increasing/decreasing the internal temperature of the process container and to avoid a decrease in productivity of substrate processing.

(e) By performing the nozzle cleaning and the F-containing layer forming prior to performing the film formation, it is possible to further increase the cleanliness in the process container and the nozzles and to further improve the quality of the film-forming process performed in the process chamber 201. Further, as in this embodiment, by performing the nozzle cleaning and the F-containing layer formation in this order prior to performing the film forming, it is possible to reduce the time required for increasing/decreasing the internal temperature of the process container and to avoid a decrease in productivity of substrate processing.

(f) By performing the chamber cleaning, the nozzle cleaning, and the F-containing layer forming prior to performing the film formation, it is possible to further increase the cleanliness in the process container and, as a result, to further improve the quality of the film-forming process performed in the process chamber 201. Further, as in this embodiment, by performing the chamber cleaning, the nozzle cleaning and the F-containing layer forming in this order prior to performing the film formation, it is possible to reduce the time required for increasing/decreasing the internal temperature of the process container and to avoid a decrease in productivity of substrate processing.

(g) By performing the pre-coating after performing the F-containing layer forming and before performing the film formation, it is possible to prevent occurrence of particles in the process chamber 201. As a result, it is possible to further improve the quality of the film-forming process performed in the process chamber 201.

(h) The occurrence of particles due to the corrosion of the inner surface of the gas supply pipe 232b by the ammonia water is particularly noticeable when the film formation is performed using a new (unused) gas supply pipe 232b, for example, when the film formation is performed after operating the substrate processing apparatus or when the film formation is performed after replacing the gas supply pipe 232b. On the other hand, when the film formation is performed using the used gas supply pipe 232b, such particles due to corrosion are unlikely to occur. This is presumably because, as using the gas supply pipe 232b, the inner surface of the gas supply pipe 232b completely reacts with the ammonia water and this reaction is saturated. Further, such particles due to corrosion hardly occur on the inner surface of the manifold 209 and the surfaces of the seal cap 219 and the rotary shaft 255, and tend to remarkably occur on the inner surface of the gas supply pipe 232b. This is considered to be caused by a difference in mixing degree and concentration of the $O_2$ gas and the $NH_3$ gas between the interior of the process container and the interior of the gas supply pipe 232b. From these points of view, it can be said that this embodiment is particularly significant when the film formation is performed using a new gas supply pipe 232b.

(i) According to this embodiment, the formation of the F-containing layer on the inner surface of the gas supply pipe 232b can not only prevent damage due to corrosion of the inner surface of the gas supply pipe 232b, but also recover damage to the inner surface of the gas supply pipe 232b when there was damage to the gas supply pipe 232b in the initial state.

(j) The effect of the F-containing layer formation on the inner surface of the gas supply pipe 232b can be maintained, until the gas supply pipe 232b is replaced next time, after the F-containing layer is formed on the inner surface of the gas supply pipe 232b.

(k) The effects of this embodiment can be obtained similarly even when a precursor gas other than the HCDS gas is used, when a C-containing gas other than the $C_3H_6$ gas is used, when an O-containing gas other than the $O_2$ gas is used, when a N- and H-containing gas other than the $NH_3$ gas is used, when a fluorine-containing gas other than the $F_2$ gas is used, when an additive gas other than the NO gas is used, or when an inert gas other than the $N_2$ gas is used.

OTHER EMBODIMENTS

While some embodiments of the present disclosure have been described in detail above, the present disclosure is not limited to the aforementioned embodiments but may be differently modified without departing from the subject matter of the present disclosure.

In the above-described embodiments, the substrate processing sequence of performing chamber cleaning→nozzle cleaning→F-containing layer forming→pre-coating→film forming in this order has been illustrated. However, as shown below, performance of any step of the chamber cleaning, the nozzle cleaning, and the pre-coating may be omitted. These cases can also obtain the same effects as the embodiments described above with reference to FIGS. 4 and 5.

F-containing layer forming→film forming
Chamber cleaning→F-containing layer forming→Film forming
Nozzle cleaning→F-containing layer forming→Film forming
Chamber cleaning→Nozzle cleaning→F-containing layer forming→Film forming
F-containing layer forming→Pre-coating→Film forming
Chamber cleaning→F-containing layer forming→Pre-coating→Film forming
Nozzle cleaning→F-containing layer forming→Pre-coating→Film forming In the film formation, a film may be formed on the wafer 200 by the gas supply sequences shown below. Even in these cases, when an O-containing gas such as O₂ gas and a N- and H-containing gas such as NH₃ gas are supplied from the gas supply pipe 232b, ammonia water may be generated in the gas supply pipe 232b. Even in these cases, by applying the method of the present disclosure, the same effects as the embodiments described above with reference to FIGS. 4 and 5 can be obtained. The C-containing gas such as the C₃H₆ gas is not limited to being supplied from the gas supply pipe 232a and the nozzle 49a, but may be supplied from the gas supply pipe 232b and the nozzle 249b. This case can also obtain the same effects as the embodiments described above with reference to FIGS. 4 and 5.

(HCDS→C₃H₆→NH₃→O₂)×n⇒SiOCN
(HCDS→O₂→NH₃)×n⇒SiON
(HCDS→NH₃→O₂)×n⇒SiON

Recipes used in each process may be prepared individually according to the processing contents and may be stored in the memory device 121c via a telecommunication line or the external memory device 123. Moreover, at the beginning of each process, the CPU 121a may properly select an appropriate recipe from the recipes stored in the memory device 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start the each process while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

The example in which films are formed using a batch-type substrate processing apparatus capable of processing a plurality of substrates at a time has been described in the above embodiments. The present disclosure is not limited to the above embodiments but may be suitably applied, for example, to a case where films are formed using a single-wafer-type substrate processing apparatus capable of processing a single substrate or several substrates at a time. In addition, the example in which films are formed using a substrate processing apparatus provided with a hot-wall-type process furnace has been described in the above embodiments. The present disclosure is not limited to the above embodiments but may be suitably applied to a case where films are formed using a substrate processing apparatus provided with a cold-wall-type process furnace.

In the case of using these substrate processing apparatuses, each process may be performed according to the same process procedures and process conditions as those in the above embodiments and modifications, and the same effects as those of the above embodiments can be achieved.

The above embodiments may be used in proper combination. The process procedures and process conditions used in this case may be the same as those of the above embodiments.

Examples

As Samples 1 to 4, a SiOCN film was formed on a wafer by performing the above-described film formation using the substrate processing apparatus shown in FIG. 1. When preparing any sample, the gas supply sequence shown in FIG. 5 was used for the film formation. Moreover, when preparing any sample, a new (unused) gas supply pipe made of metal was used to supply O₂ gas and NH₃ gas. When preparing Sample 1, F-containing layer formation was not performed prior to performing the film formation. When preparing Samples 2 to 4, F-containing layer formation was formed by performing the processing sequence shown in FIG. 4 prior to performing the film formation. When preparing Samples 2 to 4, F₂ gas was used as a F-containing gas, and the supply time of the F₂ gas in the F-containing layer formation was set to 75 minutes, 150 minutes, and 225 minutes, in that order. The other process conditions were set to predetermined conditions within the process condition range described in the above embodiments.

Figure 7:
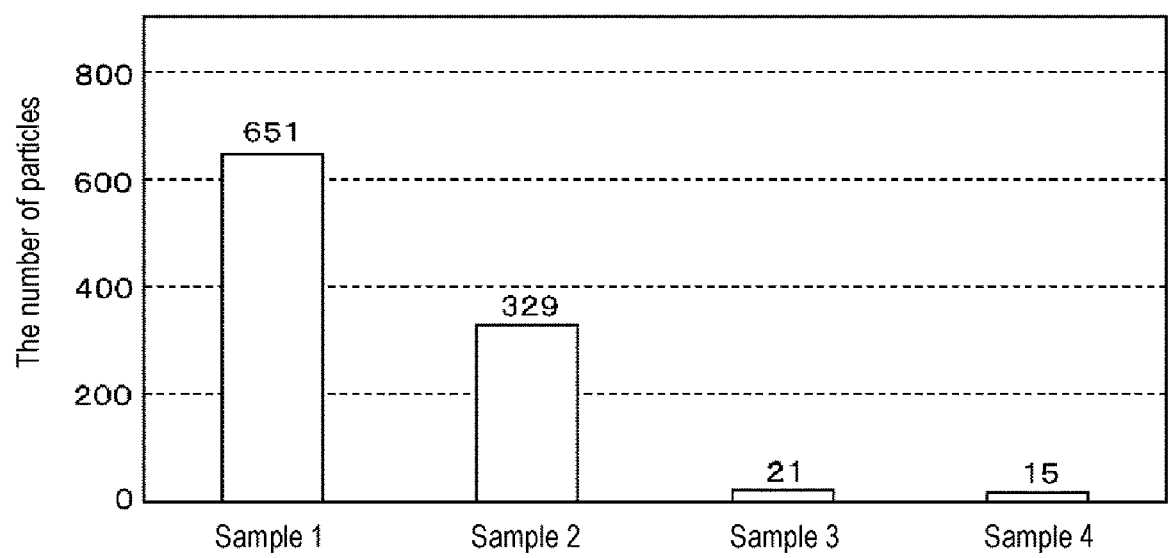
FIG. 7 is a graph showing the number of particles observed on a surface of a substrate subjected to a film-forming process.

Then, the surface of the wafer subjected to the film formation was observed, and the number of particles adsorbed on the surface of the wafer was measured. FIG. 7 shows the result of the measurement. In FIG. 7, the vertical axis represents the number of particles, and the horizontal axis represents Samples 1 to 4 in order. It can be seen from FIG. 7 that the number of particles adsorbed on the surface of the wafer can be significantly reduced by forming the F-containing layer prior to performing the film formation. In addition, it can be also seen that the above-described effects can be enhanced with the increase in the F₂ gas supply time in the F-containing layer formation and can be significantly enhanced by setting the F₂ gas supply time to 150 to 225 minutes. In addition, when the ingredients of the particles were analyzed, it was confirmed that the particles was mainly metal particles containing Fe or Ni.

According to the present disclosure, it is possible to improve the quality of substrate processing performed in a process container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) forming a film on a substrate in a process container by performing a cycle a predetermined number of times, the cycle including:
      supplying an oxygen-containing gas from a pipe made of metal to the substrate in the process container; and
      supplying a nitrogen-and-hydrogen-containing gas from the pipe to the substrate in the process container; and
   (b) forming a layer on an inner surface of the pipe by supplying a surface treatment gas into the pipe such that the surface treatment gas chemically reacts with the inner surface of the pipe.

2. The method of claim 1, wherein in (b), the layer is formed on the inner surface of the pipe to prevent a material of the pipe from being exposed inside the pipe.

3. The method of claim 1, wherein the layer prevents a chemical reaction between the inner surface of the pipe and a substance generated by a reaction between the oxygen-containing gas and the nitrogen-and-hydrogen-containing gas in the pipe in (a).

4. The method of claim 1, wherein the layer has a thickness such that the inner surface of the pipe is prevented from causing a chemical reaction with a substance generated by a reaction between the oxygen-containing gas and the nitrogen-and-hydrogen-containing gas in the pipe in (a).

5. The method of claim 1, wherein in (a), $H_2O$ is generated by a reaction of the oxygen-containing gas and the nitrogen-and-hydrogen-containing gas and $NH_4OH$ is generated by a reaction of the $H_2O$ and the nitrogen-and-hydrogen-containing gas in the pipe, and
   wherein in (b), the layer is formed on the inner surface of the pipe to have a thickness such that the inner surface of the pipe is prevented from causing a chemical reaction with the $NH_4OH$.

6. The method of claim 1, wherein the layer has a thickness in a range of 1 nm to 50 nm.

7. The method of claim 1, wherein the surface treatment gas is a fluorine-containing gas.

8. The method of claim 1, wherein the layer is a fluorine-containing layer.

9. The method of claim 1, wherein the layer is a continuous fluorine-containing layer.

10. The method of claim 1, wherein the layer is a metal fluoride layer.

11. The method of claim 1, wherein a temperature of the pipe in (b) is set to be lower than a temperature of the pipe in (a).

12. The method of claim 1, wherein a temperature of the pipe in (b) is set to be room temperature or higher and 150 degrees C. or lower.

13. The method of claim 1, wherein a material of the pipe contains Fe and Ni.

14. The method of claim 1, wherein a material of the pipe contains Fe, Ni, and Cr.

15. The method of claim 1, wherein a material of the pipe contains Fe, Ni, Cr, and Mo.

16. The method of claim 1, further comprising (c) cleaning an interior of the process container by supplying a cleaning gas into the process container,
   wherein a supply time of the surface treatment gas in (b) is longer than a supply time of the cleaning gas in(c).

17. The method of claim 16, wherein each of the surface treatment gas and the cleaning gas is a fluorine-containing gas.

18. The method of claim 1, wherein a supply time of the surface treatment gas in (b) is 75 minutes or longer and 300 minutes or shorter.

19. The method of claim 1, wherein (b) is performed before performing (a).

20. The method of claim 16, wherein (c) and (b) are performed before performing (a).

21. The method of claim 1, wherein the cycle further includes supplying a precursor gas to the substrate in the process container.

22. The method of claim 21, wherein the cycle further includes supplying a carbon-containing gas to the substrate in the process container.

23. The method of claim 1, further comprising (d) forming a pre-coating film in the process container by performing a cycle a predetermined number of times, the cycle including:
   supplying the oxygen-containing gas from the pipe into the process container; and
   supplying the nitrogen-and-hydrogen-containing gas from the pipe into the process container,
   wherein (d) is performed after performing (b) and before performing (a).

24. A surface treatment method comprising:
   (a) forming a film on a substrate in a process container by performing a cycle a predetermined number of times, the cycle including:
      supplying an oxygen-containing gas from a pipe made of metal to the substrate in the process container; and
      supplying a nitrogen-and-hydrogen-containing gas from the pipe to the substrate in the process container; and
   (b) forming a layer on an inner surface of the pipe by supplying a surface treatment gas into the pipe such that the surface treatment gas chemically reacts with the inner surface of the pipe.

25. A substrate processing apparatus comprising:
   a process container in which a substrate is processed;
   an oxygen-containing gas supply system configured to supply an oxygen-containing gas from a pipe made of metal to the substrate in the process container;
   a nitrogen-and-hydrogen-containing gas supply system configured to supply a nitrogen-and-hydrogen-containing gas from the pipe to the substrate in the process container;
   a surface treatment gas supply system configured to supply a surface treatment gas into the pipe; and
   a controller configured to be capable of controlling the oxygen-containing gas supply system, the nitrogen-and-hydrogen-containing gas supply system, and the surface treatment gas supply system to perform a process including:
      (a) forming a film on the substrate by performing a cycle a predetermined number of times, the cycle including:
         supplying the oxygen-containing gas from the pipe to the substrate in the process container; and
         supplying the nitrogen-and-hydrogen-containing gas from the pipe to the substrate in the process container; and
      (b) forming a layer on an inner surface of the pipe by supplying the surface treatment gas into the pipe such that the surface treatment gas chemically reacts with the inner surface of the pipe.

26. A non-transitory computer-readable recording medium storing a program that causes, by a computer, a substrate processing apparatus to perform a process, the process comprising:
   (a) forming a film on a substrate in a process container of the substrate processing apparatus by performing a cycle a predetermined number of times, the cycle including:
      supplying an oxygen-containing gas from a pipe made of metal to the substrate in the process container; and
      supplying a nitrogen-and-hydrogen-containing gas from the pipe to the substrate in the process container; and
   (b) forming a layer on an inner surface of the pipe by supplying a surface treatment gas into the pipe such that the surface treatment gas chemically reacts with the inner surface of the pipe.

\* \* \* \* \*